(12) United States Patent
Kwon et al.

(10) Patent No.: US 11,710,938 B2
(45) Date of Patent: Jul. 25, 2023

(54) WAVELENGTH-SELECTABLE LASER DIODE AND OPTICAL COMMUNICATION APPARATUS INCLUDING SAME

(71) Applicant: ELECTRONICS AND TELECOMMUNICATIONS RESEARCH INSTITUTE, Daejeon (KR)

(72) Inventors: Oh Kee Kwon, Sejong-si (KR); Su Hwan Oh, Daejeon (KR); Kisoo Kim, Seoul (KR); Chul-Wook Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 131 days.

(21) Appl. No.: 17/213,359

(22) Filed: Mar. 26, 2021

(65) Prior Publication Data
US 2021/0313766 A1 Oct. 7, 2021

(30) Foreign Application Priority Data
Apr. 7, 2020 (KR) ........................ 10-2020-0041886

(51) Int. Cl.
*H01S 5/12* (2021.01)
*H01S 5/06* (2006.01)
(Continued)

(52) U.S. Cl.
CPC .......... *H01S 5/0611* (2013.01); *H01S 5/1209* (2013.01); *H01S 5/1218* (2013.01);
(Continued)

(58) Field of Classification Search
CPC .. H01S 5/06256; H01S 5/0265; H01S 5/1209; H01S 5/1218
See application file for complete search history.

(56) References Cited

U.S. PATENT DOCUMENTS

| | | | |
|---|---|---|---|
| 6,885,804 B2 | 4/2005 | Park et al. | |
| 8,149,503 B2 | 4/2012 | Kim et al. | |

(Continued)

FOREIGN PATENT DOCUMENTS

| | | |
|---|---|---|
| JP | H0983087 A | 3/1997 |
| KR | 1020030067142 A | 8/2003 |

(Continued)

OTHER PUBLICATIONS

Jang-Uk Shin et al, "External cavity lasers composed of higher order gratings and SLD integrated on PLC platform," ETRI Journal, vol. 29, No. 4, pp. 452-456, Aug. 2007.

(Continued)

*Primary Examiner* — Michael Carter
(74) *Attorney, Agent, or Firm* — Rabin & Berdo, P.C.

(57) ABSTRACT

Disclosed are a wavelength-selectable laser diode and an optical communication apparatus including the same. The wavelength-selectable laser diode includes a substrate, which includes a gain region, a tuning region spaced apart from the gain region, and a phase adjusting region between the tuning region and the gain region, a waveguide layer on the substrate, a clad layer on the waveguide layer, and gratings disposed on the substrate or the clad layer in the gain region and the tuning region.

16 Claims, 8 Drawing Sheets

(51) Int. Cl.
  *H01S 5/34* (2006.01)
  *H01S 5/22* (2006.01)
  *H04B 10/50* (2013.01)

(52) U.S. Cl.
  CPC .............. *H01S 5/2228* (2013.01); *H01S 5/34* (2013.01); *H04B 10/503* (2013.01)

(56) References Cited

U.S. PATENT DOCUMENTS

| | | | |
|---|---|---|---|
| 9,407,706 | B2 | 8/2016 | Grokop et al. |
| 10,148,067 | B2 | 12/2018 | Kwon et al. |
| 10,277,008 | B1* | 4/2019 | An ................... H01S 5/062 |
| 10,931,083 | B2 | 2/2021 | Kwon et al. |
| 2006/0203858 | A1* | 9/2006 | Arimoto ............ H01S 5/4068 |
| | | | 372/20 |
| 2007/0230523 | A1* | 10/2007 | Ishikawa ........... H01S 5/0265 |
| | | | 372/50.1 |
| 2010/0034224 | A1* | 2/2010 | Takabayashi ...... H01S 5/0687 |
| | | | 372/20 |
| 2011/0293279 | A1* | 12/2011 | Lam .................. H04J 14/02 |
| | | | 398/79 |
| 2021/0376558 | A1* | 12/2021 | Nishita ............ H01S 5/06256 |

FOREIGN PATENT DOCUMENTS

| | | | |
|---|---|---|---|
| KR | 20050123204 | A | 12/2005 |
| KR | 20100040481 | A | 4/2010 |
| KR | 20120064507 | A | 6/2012 |
| KR | 102078573 | B1 | 2/2020 |
| KR | 102188960 | B1 | 12/2020 |

OTHER PUBLICATIONS

Jong-In Shim et al., "Lasing characteristics of 1.5 urn GaInAsP-InP SCH-BIG-DR lasers," IEEE Journal of Quantum Electronics, vol. 27, No. 6, pp. 1736-1745, Jun. 1991.

Oh Kee Kwon et al., "Monolithically integrated multiwavelength grating cavity laser," IEEE Photonics Technology Letter, vol. 17, No. 9, pp. 1788-1790, Sep. 2005.

V. Jayaraman et al., "Theory, design, and performance of extended tuning range semiconductor lasers with sampled gratings," IEEE Journal of Quantum Electronics, vol. 29, No. 6, pp. 1824-1834, Jun. 1993.

* cited by examiner

WAVELENGTH-SELECTABLE LASER DIODE AND OPTICAL COMMUNICATION APPARATUS INCLUDING SAME

CROSS-REFERENCE TO RELATED APPLICATIONS

This U.S. non-provisional patent application claims priority under 35 U.S.C. § 119 of Korean Patent Application No. 10-2020-0041886, filed on Apr. 7, 2020, the entire contents of which are hereby incorporated by reference.

BACKGROUND

The present disclosure herein relates to an optical communication apparatus, and more particularly, to a wavelength-selectable laser diode, which is capable of implementing a multichannel light source, and an optical communication apparatus including the same.

Recently, as mobile communication fronthaul, a backhaul network, a next generation optical network, and data center network have large capacities, a demand of wavelength division multiplexed (WDM) systems are rapidly increasing. Generally light sources for the WDM systems may have a structure in which a single wavelength laser diode module operating in a wavelength channel slot is mounted to each of input terminals of system equipment. In addition, the general light sources for the WDM systems may have limitations in that an increase in the number of channels enlarges the equipment, increases energy consumption, and complicates the system. In the future, through the introduction of a light source for a WDM system in which a plurality of channel wavelengths may be provided from a single module, improvements are required for miniaturization of system equipment and low energy consumption.

SUMMARY

The present disclosure provides a wavelength-selectable laser diode, which is capable of generating an oscillation wavelength of a laser beam that matches WDM wavelength grid, and an optical communication apparatus including the same.

The present disclosure also provides an optical communication apparatus capable of increasing the reliability and lifespan of elements thereof.

An embodiment of the inventive concept provides a wavelength-selectable laser diode. The wavelength-selectable laser diode includes: a substrate including a gain region, a tuning region spaced apart from the gain region, and a phase adjusting region between the tuning region and the gain region; a waveguide layer on the substrate; a clad layer on the waveguide layer; and gratings disposed on the substrate or the clad layer in the gain region and the tuning region. Here, the gratings may include: a first grating disposed in the gain region and having a first grating length; and a second grating disposed in the tuning region and having a second grating length different from the first grating length.

In an embodiment, the first grating may include first unit gratings, and the second grating may include second unit gratings same as the first unit gratings.

In an embodiment, the first unit gratings may have a first pitch, and the second unit gratings may have a second pitch different from the first pitch.

In an embodiment, the first grating may further include first group gratings which are formed by grouping the first unit gratings and have a first sampling length longer than the first pitch.

In an embodiment, the second grating may include second group gratings which are formed by grouping the second unit gratings and have a second sampling length longer than the second pitch, the second sampling length different from the first sampling length.

In an embodiment, the first unit gratings may have an 11th pitch, a 12th pitch, and a 13th pitch, and the second unit gratings may have a 21st pitch, a 22nd pitch, and a 23rd pitch different from the 11th pitch, the 12th pitch, and the 13th pitch, respectively.

In an embodiment, the first grating may include a 11th sub-group grating, a 12th sub-group grating, and a 13th sub-group grating which are formed by grouping the first unit gratings and have a 11th super structure grating length, a 12th super structure grating length, and a 13th super structure grating length that are longer than the 11th pitch, the 12th pitch, and the 13th pitch, respectively.

In an embodiment, the second grating may include a 21st sub-group grating, a 22nd sub-group grating, and a 23rd sub-group grating which are formed by grouping the second unit gratings and have a 21st super structure grating length, a 22nd super structure grating length, and a 23rd super structure grating length that are different from the 11th super structure grating length, the 12th super structure grating length, and the 13th super structure grating length, respectively.

In an embodiment, the first grating and the second grating may include a sampled grating.

In an embodiment, the first grating and the second grating may include a super structure grating.

In an embodiment, the waveguide layer may include: a first active waveguide disposed in the gain region; and a passive waveguide disposed in the phase adjusting region and the tuning region.

In an embodiment, the substrate may further include a modulating region adjacent to the tuning region, and the waveguide layer may further include a second active waveguide disposed in the modulating region.

In an embodiment, the substrate may further include an amplifying region disposed adjacent to the modulating region, and the first active waveguide may be disposed in the amplifying region.

In an embodiment, the wavelength-selectable laser diode may further include an electrode layer which includes electrodes disposed on the waveguide layer and pads connected to the electrodes and disposed on the clad layer outside the waveguide layer, and the electrodes may include: a plate electrode on the gain region; and a heater electrode on the phase adjusting region and the tuning region.

In an embodiment, the electrodes may further include a cavity ring that surrounds one of the pads on the modulating region, and the cavity ring may be disposed adjacent to the waveguide layer.

In an embodiment, the wavelength-selectable laser diode may further include: a lower electrode layer disposed below the substrate; and a total reflection layer disposed on a side wall of the substrate adjacent to the gain region.

In an embodiment of the inventive concept, an optical communication apparatus includes: a plurality of wavelength-selectable laser diodes; and an optical combiner connected to the plurality of wavelength-selectable laser diodes. Here, the each of the plurality of wavelength-selectable laser diodes may include: a substrate including a gain region, a tuning region spaced apart from the gain region, and a phase adjusting region between the tuning region and the gain region; a waveguide layer on the substrate; a clad layer on the waveguide layer; and gratings disposed on the substrate or the clad layer in the gain region and the tuning region. The gratings may include: a first grating disposed in the gain region and having a first grating length; and a second grating disposed in the tuning region and having a second grating length different from the first grating length.

In an embodiment, the optical communication apparatus may further include an optical amplifier connected to the optical combiner.

In an embodiment, the optical communication apparatus may further include optical waveguides which are connected to the waveguide layer and connect the plurality of wavelength-selectable laser diodes to the optical combiner.

In an embodiment, one of the plurality of wavelength-selectable laser diodes may be residual.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, embodiments of the inventive concept will be described in detail with reference to the accompanying drawings. Advantages and features of the present disclosure, and implementation methods thereof will be clarified through following embodiments described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims. Like reference numerals refer to like elements throughout.

The terms used in this specification are used only for explaining embodiments while not limiting the present disclosure. In this specification, the singular forms include the plural forms as well, unless the context clearly indicates otherwise. The meaning of 'comprises' and/or 'comprising' used in the specification does not exclude the presence or addition of one or more components, steps, operations, and/or elements other than the mentioned components, steps, operations, and/or devices. Also, in the specification, a gain, tuning, a waveguide, and clad may be understood as having a meaning mainly used in optical field. Since the following description is based on embodiments, the order of the reference numerals given in the description is not limited thereto.

Figure 1:
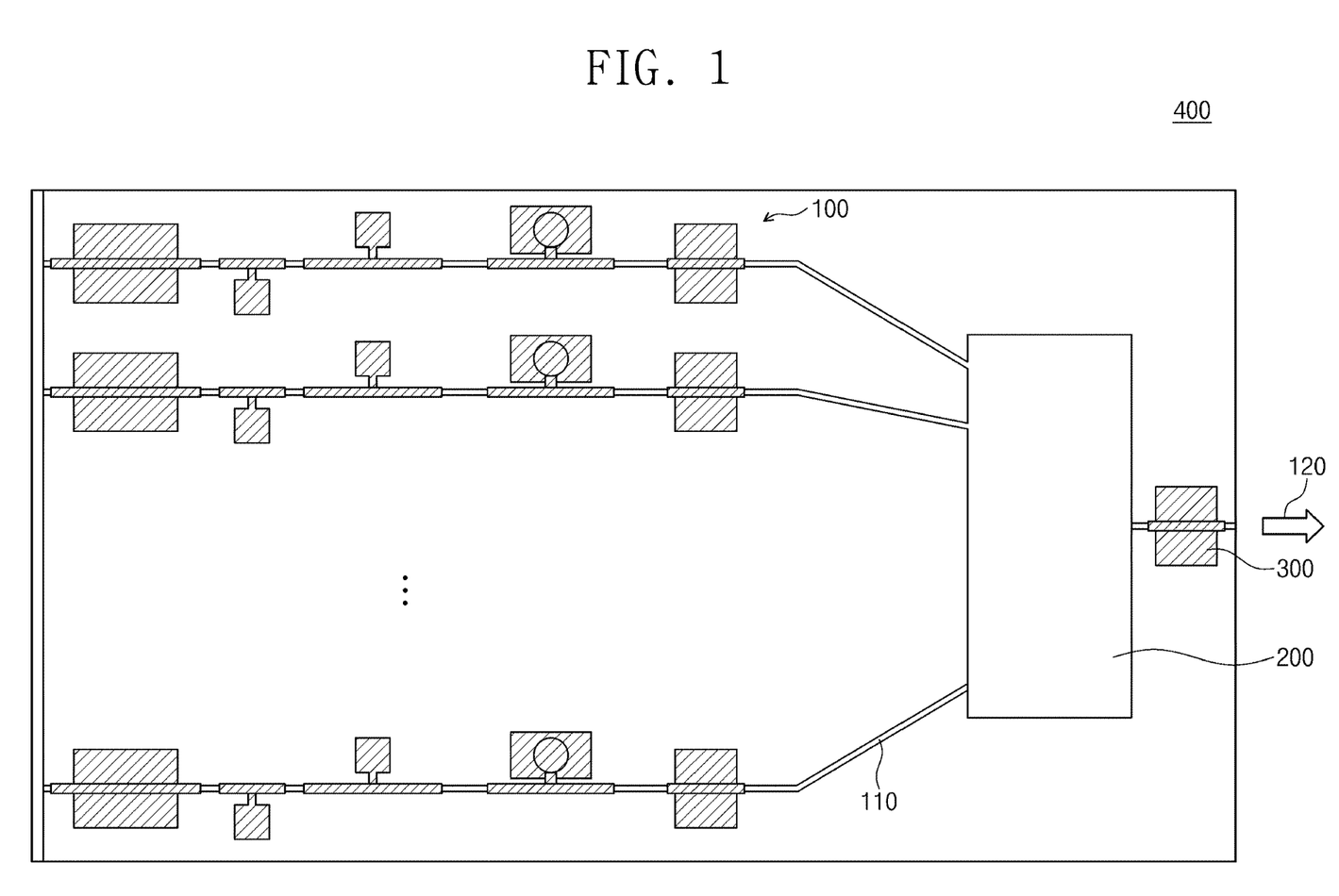
FIG. 1 is a plan view showing an optical communication apparatus according to the inventive concept.

FIG. 1 illustrates an optical communication apparatus 400 according to the inventive concept.

Referring to FIG. 1, the optical communication apparatus 400 according to an embodiment of the inventive concept may include a wavelength division multiplexing system. For example, the optical communication apparatus 400 of an embodiment of the inventive concept may include a plurality of wavelength-selectable laser diodes 100, an optical combiner 200, and an optical amplifier 300. The plurality of wavelength-selectable laser diodes 100 may be arranged in the form of array. The wavelength-selectable laser diodes 100 may generate a laser beam 120 and provide the same to the optical combiner 200 and the optical amplifier 300. The laser beam 120 may have multichannel wavelengths. The optical combiner 200 may be disposed between the wavelength-selectable laser diodes 100 and the optical amplifier 300. Through optical waveguides 110, the wavelength-selectable laser diodes 100 may be connected to the optical combiner 200, and the optical combiner 200 may be connected to the optical amplifier 300. The laser beam 120 may be amplified by the optical amplifier 300 and then output to the outside.

Figure 2:
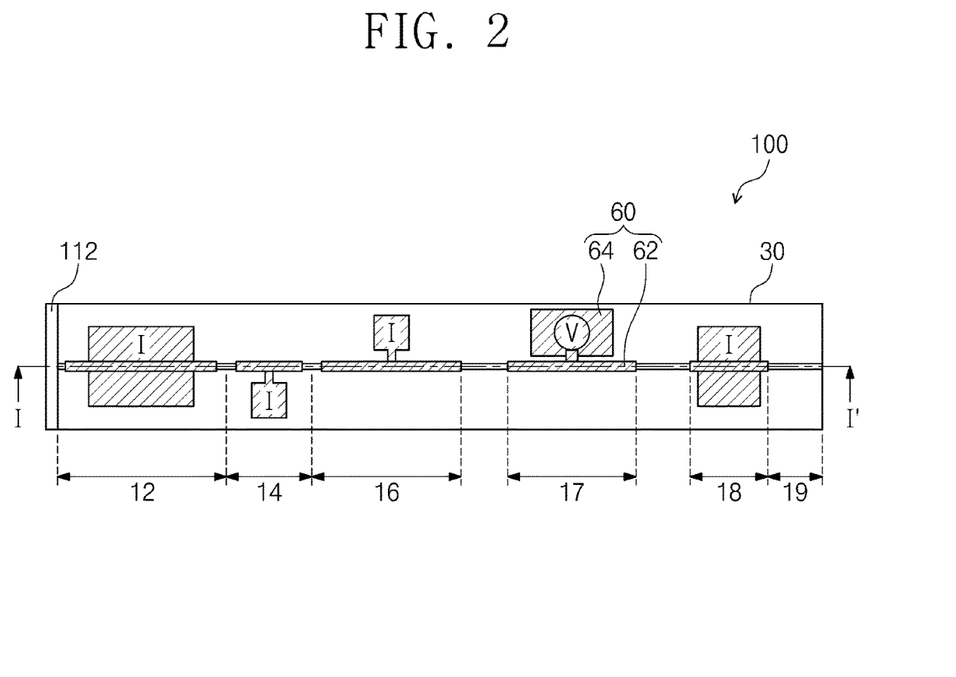
FIG. 2 is a plan view showing an example of each of a wavelength-selectable laser diodes of FIG. 1.
Figure 3:
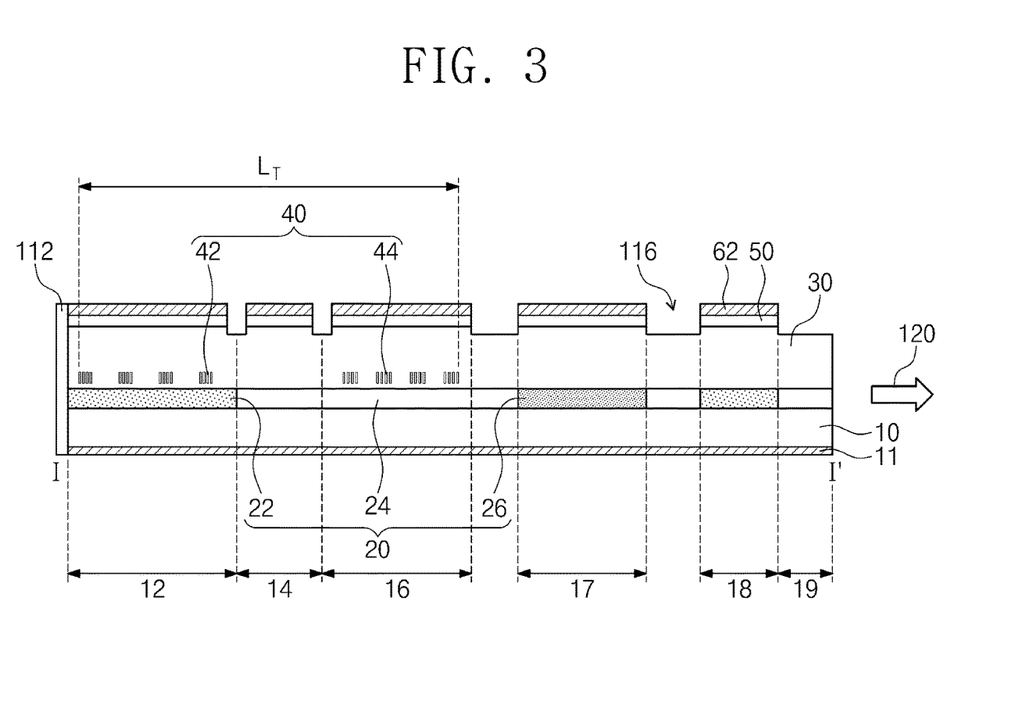
FIG. 3 is a cross-sectional view taken along line I-I' of FIG. 2.

FIG. 2 illustrates an example of each of the wavelength-selectable laser diodes 100 of FIG. 1. FIG. 3 illustrates a view taken along line I-I' of FIG. 2.

Referring to FIGS. 2 and 3, the wavelength-selectable laser diode 100 may include an infrared laser diode or a visible light laser diode. As one example, the wavelength-selectable laser diode 100 may include a substrate 10, a waveguide layer 20, a clad layer 30, gratings 40, an ohmic contact layer 50, and an electrode layer 60.

The substrate 10 may include a group III-V semiconductor layer. For example, the substrate 10 may include n-type InP. The substrate 10 may have a gain region 12, a phase adjusting region 14, a tuning region 16, a modulating region 17, an amplifying region 18, and a converting region 19.

The gain region 12 may be an area which gets a gain of a laser beam 120 to generate the laser beam 120. A total reflection layer 112 may be provided on one side of substrate of the gain region 12. The total reflection layer 112 may reflect the laser beam 120 from the gain region 12 to the phase adjusting region 14. The total reflection layer 112 may allow the laser beam 120 to resonate. For example, the total reflection layer 112 may include metal such as aluminum (Al) or sliver (Ag), but the embodiment of the inventive concept is not limited thereto.

The phase adjusting region 14 may be disposed between the gain region 12 and the tuning region 16. The phase adjusting region 14 may be an area which adjusts a phase of the laser beam 120.

The tuning region 16 may be disposed between the phase adjusting region 14 and the modulating region 17. The tuning region 16 may be an area which tunes a wavelength of the laser beam 120.

The modulating region 17 may be disposed between the tuning region 16 and the amplifying region 18. The modulating region 17 may be an area which modulates the laser beam 120.

The amplifying region 18 may be disposed between the modulating region 17 and the converting region 19. The amplifying region 18 may be an area which amplifies intensity of the laser beam 120.

The converting region 19 may be an area which converts the size and/or diameter of the laser beam 120. A lower electrode layer 11 may be disposed below the substrate 10. Although not illustrated, an anti-reflective layer may be disposed on the other side of the substrate 10 of the converting region 19. The anti-reflective layer may allow the laser beam 120 to pass therethrough. For example, the anti-reflective layer may include metal oxide including indium titanium oxide (ITO), but the embodiment of the inventive concept is not limited thereto.

The waveguide layer 20 may be disposed on the substrate 10. The waveguide layer 20 may have a refractive index higher than that of the substrate 10. The waveguide layer 20 may extend from the gain region 12 to the converting region 19. The waveguide layer 20 may be connected to the optical waveguides 110. The laser beam 120 may be transmitted along the waveguide layer 20. For example, the waveguide layer 20 may include InGaAs. As one example, the waveguide layer 20 may include a first active waveguide layer 22, a passive waveguide layer 24, and a second active waveguide layer 26.

The first active waveguide layer 22 may be disposed in the gain region 12 and the amplifying region 18. When an electric field is provided between the substrate 10 and the clad layer 30, the first active waveguide layer 22 in the gain region 12 may get or increase a gain of the laser beam 120. The first active waveguide layer 22 in the amplifying region 18 may amplify the intensity of the laser beam 120. For example, the first active waveguide layer 22 may include p+ InGaAs. Unlike the above example, the first active waveguide layer 22 may include rare earth element impurities such as erbium (ER), but the embodiment of the inventive concept is not limited thereto.

The passive waveguide layer 24 may be disposed in the phase adjusting region 14, the tuning region 16, and the converting region 19. The passive waveguide layer 24 may include n+ InGaAs.

The second active waveguide layer 26 may be disposed in the modulating region 17. The second active waveguide layer 26 may have a bulk material, a multiple quantum well (MQW) structure, or a selective region grown (SAG) MQW structure.

The clad layer 30 may be disposed on the waveguide layer 20 and the substrate 10 outside the waveguide layer 20. The clad layer 30 may have a refractive index lower than that of the waveguide layer 20 and equal or similar to that of the substrate 10. For example, the clad layer 30 may include p+ InP. If the substrate 10 is regarded as a lower clad layer, the clad layer 30 may be an upper clad layer. As one example, the clad layer 30 may have trenches 116. The trenches 116 may separate the gain region 12, the phase adjusting region 14, the tuning region 16, the modulating region 17, the amplifying region 18, and the converting region 19 from each other.

The ohmic contact layer 50 may be disposed on the clad layer 30. The ohmic contact layer 50 may electrically connect the clad layer 30 to the electrode layer 60. The ohmic contact layer 50 may include at least one metal of tungsten (W), tantalum (Ta), titanium (Ti), cobalt (Co), or manganese (Mn).

The electrode layer 60 may be disposed on the ohmic contact layer 50. As one example, the electrode layer 60 may include electrodes 62 and pads 64. The electrodes 62 may be disposed on the waveguide layer 20.

The pads 64 may be disposed on the clad layer 30 outside the waveguide layer 20. Although not illustrated, external lines may be connected to the pads 64. External power may be provided through the lines. The electrodes 62 may use the power to provide electric current between the clad layer 30 and the substrate 10, thereby changing the refractive index of the clad layer 30. The wavelength and/or intensity of the laser beam 120 may be controlled according to the electric current and refractive index. In FIG. 2, a symbol I illustrated inside the pads 64 may represent electric current, and a symbol V may represent voltage.

The gratings 40 may be disposed in the clad layer 30 in the gain region 12 and the tuning region 16. The gratings 40 may be cavities or defects in the clad layer 30. As one example, the gratings 40 may include a first grating 42 and a second grating 44. The first grating 42 may be disposed in the gain region 12. The second grating 44 may be disposed in the tuning region 16.

Figure 4:
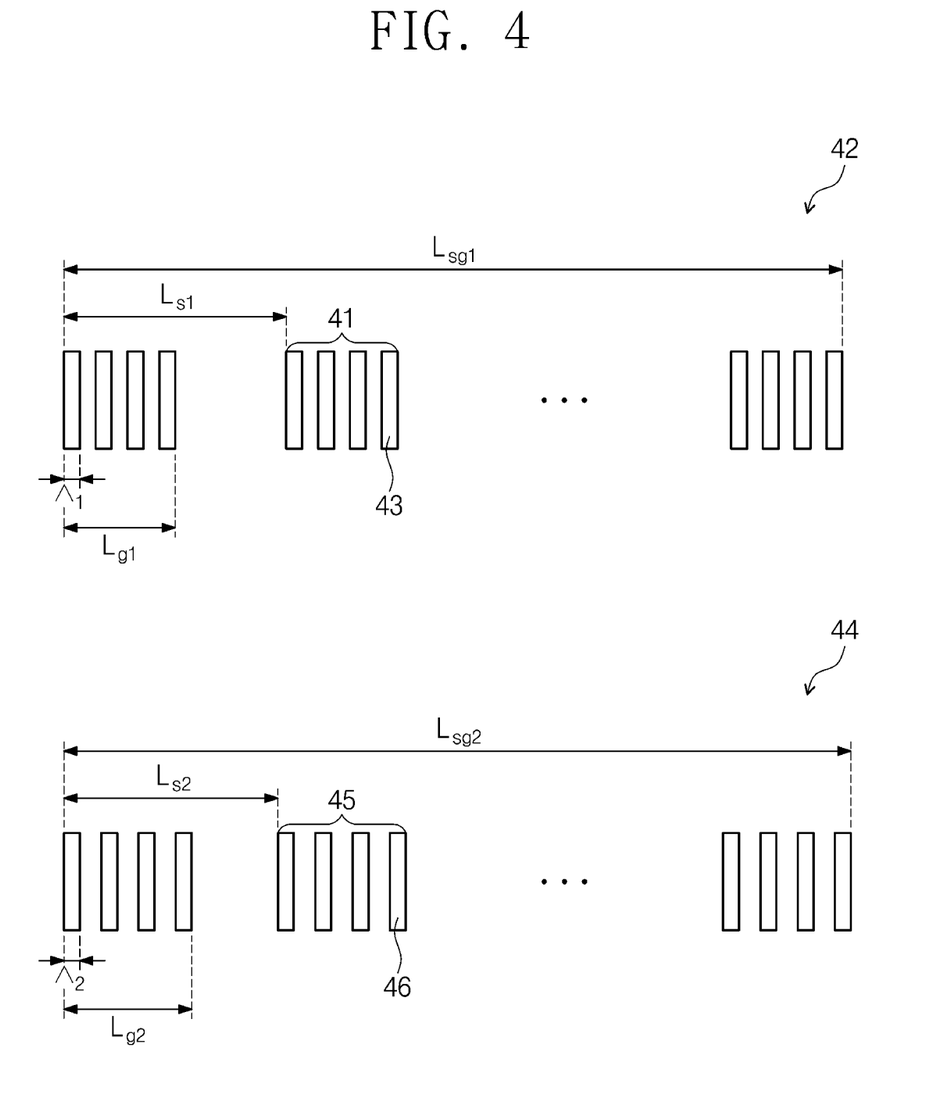
FIG. 4 is a view showing examples of a first grating and a second grating of FIG. 3.

FIG. 4 shows examples of the first grating 42 and the second grating 44 of FIG. 3.

Referring to FIG. 4, each of the first grating 42 and the second grating 44 may be a sampled grating. For example, the first grating 42 may have a first grating length $L_{sg1}$ of about 1 mm, but the embodiment of the inventive concept is not limited thereto. As one example, the first grating 42 may include first unit gratings 43 and first group gratings 41. Each of the first unit gratings 43 may have a rectangular shape. The first unit gratings 43 may have a first pitch $\Lambda_1$. For example, the first pitch $\Lambda_1$ may be about 100 nm. The first unit gratings 43 may be grouped for every first breaking lengths $L_{g1}$ to form the first group gratings 41. The first breaking length $L_{g1}$ may be about 400 nm, but the embodiment of the inventive concept is not limited thereto. The first group gratings 41 may have a first sampling length $L_{S1}$. The first sampling length $L_{S1}$ may be about 1 μm, but the embodiment of the inventive concept is not limited thereto.

The second grating 44 may have a length or distance different from that of the first group grating 41. For example, the second grating 44 may have a second grating length $L_{sg2}$ different from that of the first grating length $L_{sg1}$. The second grating length $L_{sg2}$ may be about 1.1 mm, but the embodiment of the inventive concept is not limited thereto. As one example, the second grating 44 may include second unit gratings 46 and second group grating 45. The second unit gratings 46 may be same as or similar to the first unit gratings 43. The second unit gratings 46 may have a second pitch $\Lambda_2$. The second pitch $\Lambda_2$ may be different from the first pitch $\Lambda_1$. For example, the second pitch $\Lambda_2$ may be about 110 nm, but the embodiment of the inventive concept is not limited thereto. The second unit gratings 46 may be grouped for every second breaking lengths $L_{g2}$ to form the second group gratings 45. The second breaking length $L_{g2}$ may be different from the first breaking length $L_{g1}$. For example, the second breaking length $L_{g2}$ may be about 500 nm, but the embodiment of the inventive concept is not limited thereto. The second group gratings 45 may have a second sampling length $L_{S2}$. The second sampling length $L_{S2}$ may be different from the first sampling length $L_{S1}$. For example, the second sampling length $L_{S2}$ may be about 0.9 µm, but the embodiment of the inventive concept is not limited thereto.

Figure 5:
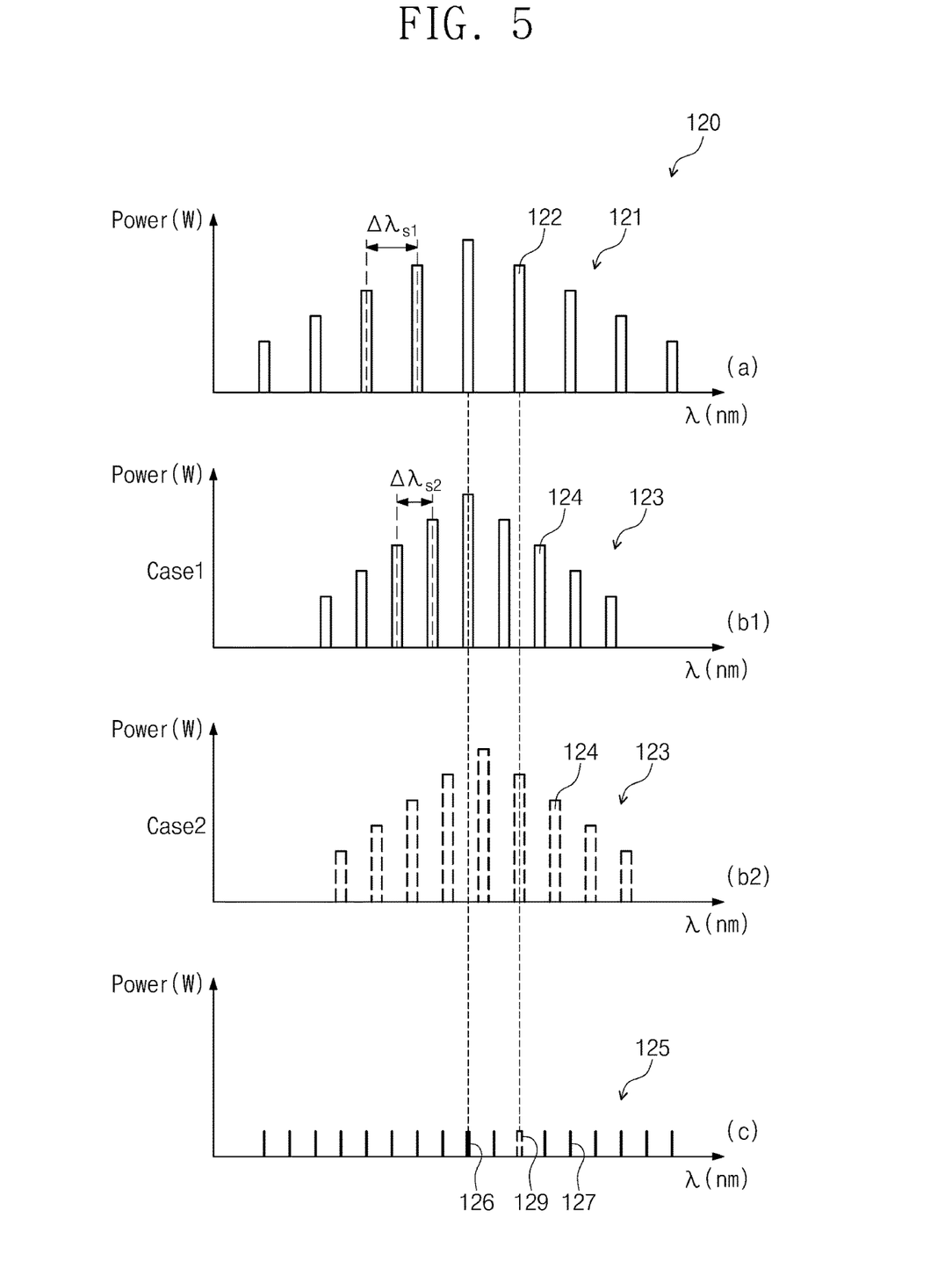
FIG. 5 shows graphs of wavelengths of a laser beam selected by the first grating and the second grating of FIG. 4.

FIG. 5 shows wavelengths of the laser beam 120 selected by the first grating 42 and the second grating 44 of FIG. 4.

Referring to FIGS. 4 and 5, the first grating 42 may reflect a first reflection mode spectrum 121 of first wavelengths 122 having a first wavelength distance $\Delta\lambda_{S1}$, and the second grating 44 may reflect a second reflection mode spectrum 123 of second wavelengths 124 having a second wavelength distance $\Delta\lambda_{S2}$.

The first wavelength distance $\Delta\lambda_{S1}$ may be determined by the first pitch $\Lambda_1$, the first breaking length $L_{g1}$, and the first sampling length $L_{S1}$. As illustrated in (a) of FIG. 5, the first reflection mode spectrum 121 may include the first wavelengths 122 having the first wavelength distance $\Delta\lambda_{S1}$.

The second wavelength distance $\Delta\lambda_{S2}$ may be determined by the second pitch $\Lambda_2$, the second breaking length $L_{g2}$, and the second sampling length $L_{S2}$. Since the second sampling length $L_{S2}$ is different from the first sampling length $L_{S1}$, the second wavelength distance $\Delta\lambda_{S2}$ may be different from the first wavelength distance $\Delta\lambda_{S1}$. The second reflection mode spectrum 123 may include the second wavelengths 124 having the second wavelength distance $\Delta\lambda_{S2}$. One of the first wavelengths 122 and one of the second wavelengths 124 overlap each other, and thus a first overlapped wavelength 126 or a second overlapped wavelength 129 may be selected and/or obtained. The first overlapped wavelength 126 and the second overlapped wavelength 129 may have power or intensities which are calculated by multiplying the power of the first wavelengths 122 by the power of the second wavelengths 124.

Referring to (a), (b1), and (c) of FIG. 5, when the maximum wavelength of the first wavelengths 122 matches the maximum wavelength of the second wavelengths 124 (Case 1), the first overlapped wavelength 126 may be selected. The first overlapped wavelength 126 may match one of third wavelengths 127 of a cavity mode 125. The cavity mode 125 may be determined by a total distance $L_T$ of the first grating 42 and the second grating 44. When the total distance $L_T$ of the first grating 42 and the second grating 44 increases, the number of the third wavelengths 127 may increase. The cavity mode 125 may be WDM wavelength grid. The first overlapped wavelength 126 may be selected as an oscillation wavelength of the laser beam 120. Thus, the first grating 42 and the second grating 44 may generate the oscillation wavelength of the laser beam 120 with respect to the first overlapped wavelength 126 that matches the WDM wavelength grid of the cavity mode 125.

Referring to (a), (b2), and (c) of FIG. 5, when the refractive indexes of the substrate 10, the waveguide layer 20, and the clad layer 30 in the phase adjusting region 14 and the tuning region 16 are changed, the second reflection mode spectrum 123 may be shifted along a wavelength axis. When the second reflection mode spectrum 123 is shifted along the wavelength axis (Case 2), one of the first wavelengths 122 and one of the second wavelengths 124 match each other, and thus the second overlapped wavelength 129 may be selected. The second overlapped wavelength 129 may be different from the first overlapped wavelength 126 and match one of the third wavelengths 127 of the cavity mode 125. Thus, the first grating 42 and the second grating 44 may generate the oscillation wavelength of the laser beam 120 with respect to the second overlapped wavelength 129 that matches the cavity mode 152.

Figure 6:
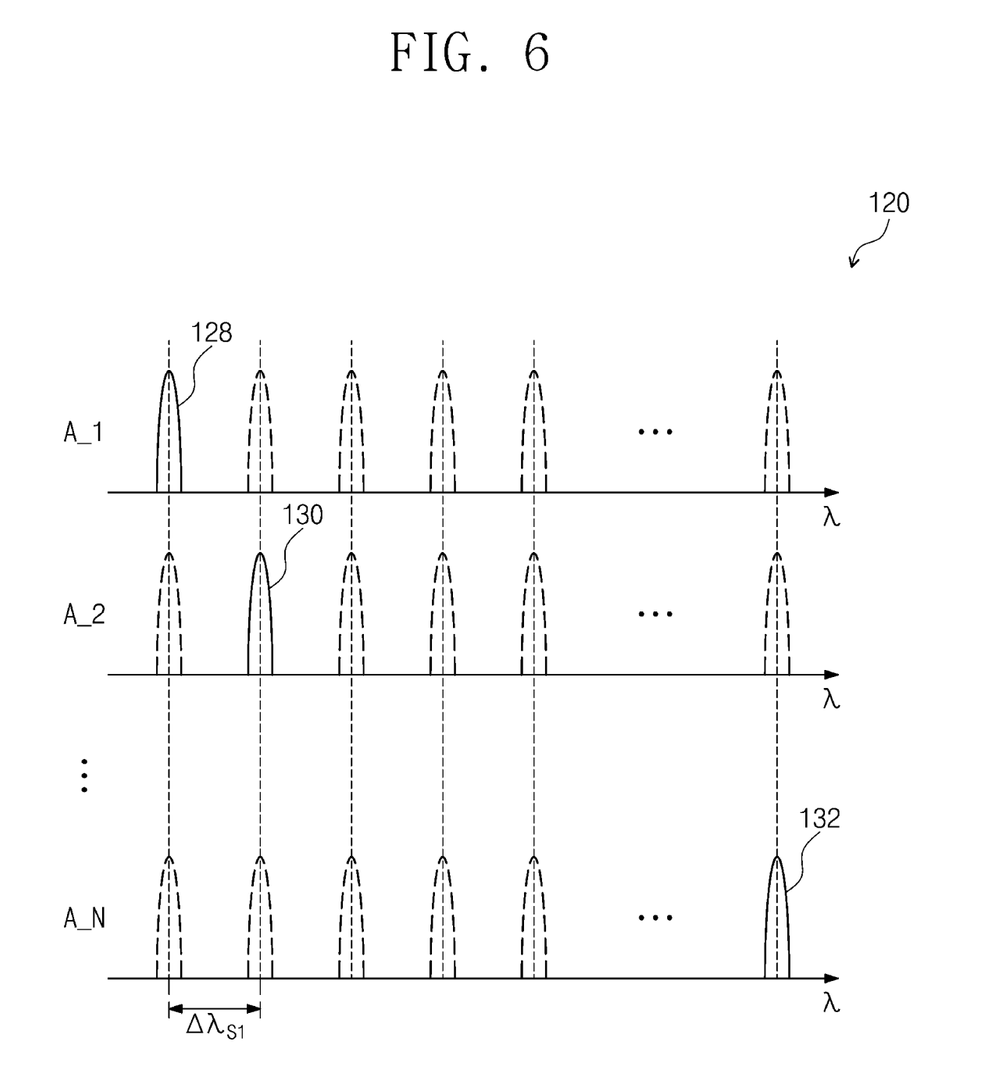
FIG. 6 shows graphs of first, second, and n-th selected wavelengths of a laser beam of a plurality of wavelength-selectable laser diodes of FIG. 1.

FIG. 6 shows first, second, and n-th selected wavelengths 128, 130, and 132 of the laser beam 120 of the plurality of wavelength-selectable laser diodes 100 of FIG. 1.

Referring to FIGS. 1 and 6, the plurality of wavelength-selectable laser diodes 100 may output the laser beam 120 having the first, second, and n-th selected wavelengths 128, 130, and 132. The first, second, and n-th selected wavelengths 128, 130, and 132 may be arranged at an interval of a first wavelength distance $\Delta\lambda_{S1}$.

The wavelength-selectable laser diode 100 of a first array A_1 may output the laser beam 120 having the first selected wavelength 128. The first selected wavelength 128 may correspond to the first overlapped wavelength 126.

The wavelength-selectable laser diode 100 of a second array A_2 may output the laser beam 120 having the second selected wavelength 130. The second selected wavelength 130 may correspond to the second overlapped wavelength 129.

The wavelength-selectable laser diode 100 of an n-th array A N may output the laser beam 120 having the n-th selected wavelength 132. Although not illustrated, the n-th selected wavelength 132 may correspond to an n-th overlapped wavelength. The wavelength-selectable laser diode 100 of the n-th array A N may be residual.

When the wavelength-selectable laser diode 100 of the first array A_1 or the second array A_2 is failed, a control unit may control the refractive index of the tuning region 16 of the wavelength-selectable laser diode 100 of the n-th array A N, thus outputting the laser beam 120 having the first overlapped wavelength 126 or the second overlapped wavelength 129. Thus, the wavelength-selectable laser diode 100 of the n-th array A N may substitute for the failed wavelength-selectable laser diode 100 of the first array A_1 or the second array A_2, and thus the reliability and lifespan of the optical communication apparatus 400 may be enhanced.

Figure 7:
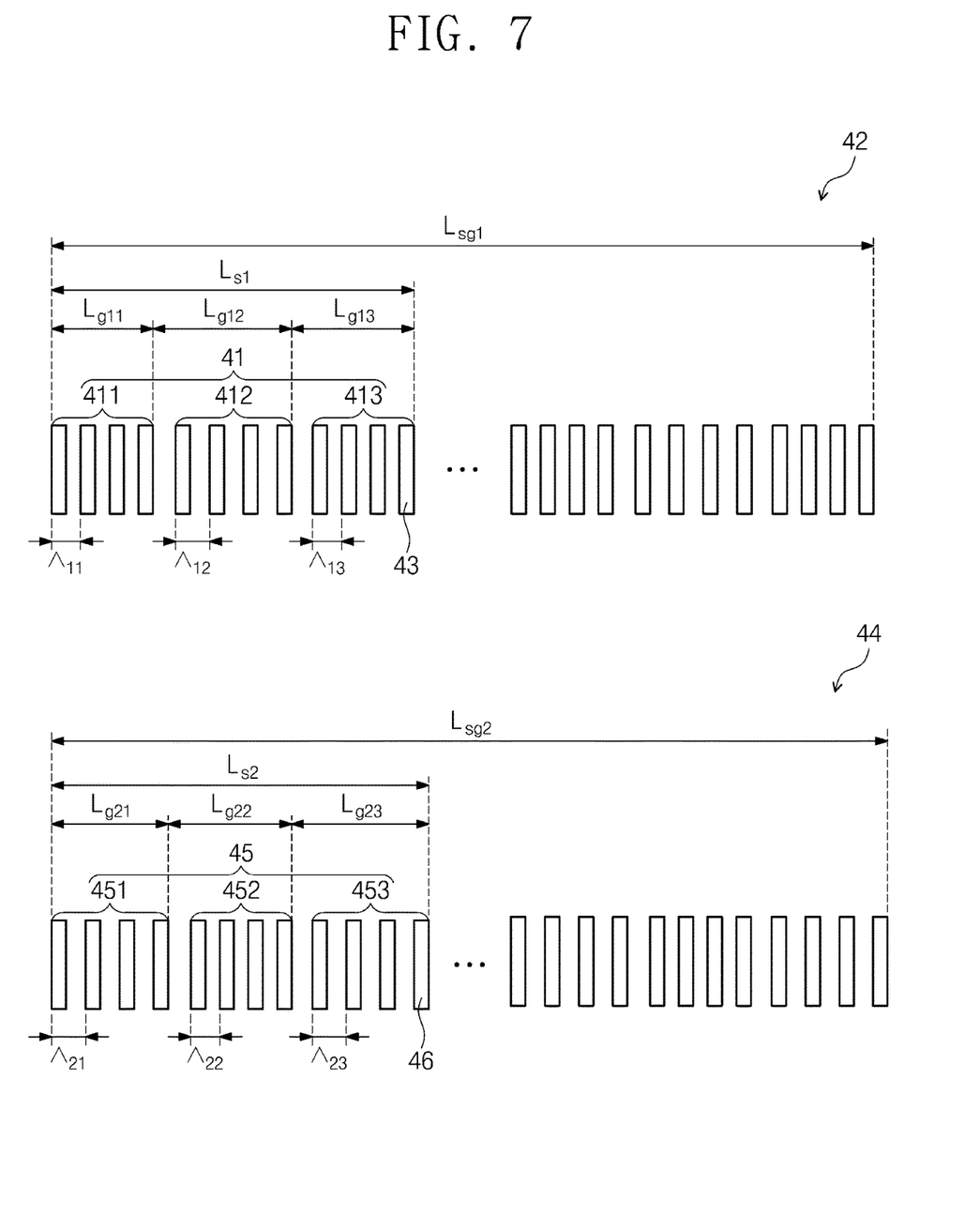
FIG. 7 is a view showing examples of a first grating and a second grating of FIG. 3.

FIG. 7 shows examples of the first grating 42 and the second grating 44 of FIG. 3.

Referring to FIG. 7, each of the first grating 42 and the second grating 44 may be a super structure grating. The first grating 42 may be disposed in a first grating length $L_{sg1}$ of about 1 mm. As one example, the first grating 42 may include first unit gratings 43, 11th to 13th sub-group gratings 411, 412, and 413, and first group gratings 41.

The first unit gratings 43 may be grouped to form the 11th to 13th sub-group gratings 411, 412, and 413. The first unit gratings 43 may have an 11th pitch $\Lambda_{11}$, a 12th pitch $\Lambda_{12}$, and a 13th pitch $\Lambda_{13}$ in the 11th to 13th sub-group gratings 411, 412, and 413, respectively. The 11th pitch $\Lambda_{11}$, the 12th pitch $\Lambda_{12}$, and the 13th pitch $\Lambda_{13}$ may be different from each other. For example, the 11th pitch $\Lambda_{11}$ may be about 100 nm, the 12th pitch $\Lambda_{12}$ may be about 110 nm, and the 13th pitch $\Lambda_{13}$ may be about 105 nm, but the embodiment of the inventive concept is not limited thereto.

The 11th to 13th sub-group gratings 411, 412, and 413 may have 11th to 13th super structure grating lengths $L_{g11}$, $L_{g12}$, and $L_{g13}$, respectively, and be arranged continuously. The 11th to 13th super structure grating lengths $L_{g11}$, $L_{g12}$, and $L_{g13}$ may be different from each other. For example, the 11th super structure grating length $L_{g11}$ may be about 400 nm, the 12th super structure grating length $L_{g12}$ may be about 440 nm, and the 13th super structure grating length $L_{g13}$ may be about 420 nm, but the embodiment of the inventive concept is not limited thereto. The 11th to 13th sub-group gratings 411, 412, and 413 may be grouped to form the first group gratings 41.

The first group gratings 41 may be arranged repeatedly in the first grating length $L_{sg1}$. Each of the first group gratings 41 may be disposed in a first sampling length $L_{S1}$. The first sampling length $L_{S1}$ may be about 1260 nm, but the embodiment of the inventive concept is not limited thereto.

The second grating 44 may be different from the first grating 42. The second grating 44 may be disposed in a second grating length $L_{sg2}$ of about 1.1 mm. As one example, the second grating 44 may include second unit gratings 46, 21st to 23rd sub-group gratings 451, 452, and 453, and second group gratings 45.

The second unit gratings 46 may be same as or similar to the first unit gratings 43. The second unit gratings 46 may be grouped to form the 21st to 23rd sub-group gratings 451, 452, and 453. The second unit gratings 46 may form the 21st to 23rd sub-group gratings 451, 452, and 453. The second unit gratings 46 may have a 21st pitch $\Lambda_{21}$, a 22nd pitch $\Lambda_{22}$, and a 23rd pitch $\Lambda_{23}$ in the 21st to 23rd sub-group gratings 451, 452, and 453, respectively. For example, the 21st pitch $\Lambda_{21}$ may be about 110 nm, the 22nd pitch $\Lambda_{22}$ may be about 105 nm, and the 23rd pitch $\Lambda_{23}$ may be about 115 nm, but the embodiment of the inventive concept is not limited thereto.

The 21st to 23rd sub-group gratings 451, 452, and 453 may be different from the 11th to 13th sub-group gratings 411, 412, and 413. The 21st to 23rd sub-group gratings 451, 452, and 453 may have 21st to 23rd super structure grating lengths $L_{g21}$, $L_{g22}$, and $L_{g23}$, respectively, and be arranged continuously. The 21st to 23rd super structure grating lengths $L_{g21}$, $L_{g22}$, and $L_{g23}$ may be different from each other. For example, the 21st super structure grating length $L_{g21}$ may be about 440 nm, the 22nd super structure grating length $L_{g22}$ may be about 420 nm, and the 23rd super structure grating length $L_{g23}$ may be about 460 nm, but the embodiment of the inventive concept is not limited thereto. The 21st to 23rd sub-group gratings 451, 452, and 453 may be grouped to form the second group gratings 45.

The second group gratings 45 may be different from the first group gratings 41. The second group gratings 45 may be arranged repeatedly in the second grating length $L_{sg2}$. Each of the second group gratings 45 may be disposed in a second sampling length $L_{S2}$. The second sampling length $L_{S2}$ may be about 1420 nm.

Figure 8:
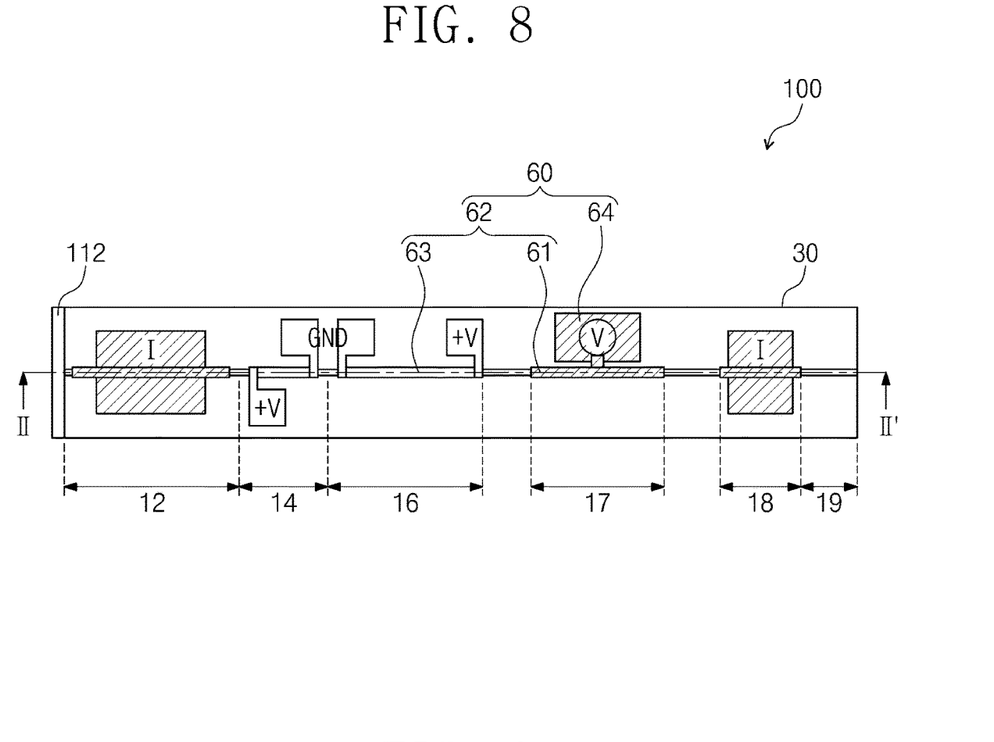
FIG. 8 is a plan view showing an example of a wavelength-selectable laser diode of FIG. 1.
Figure 9:
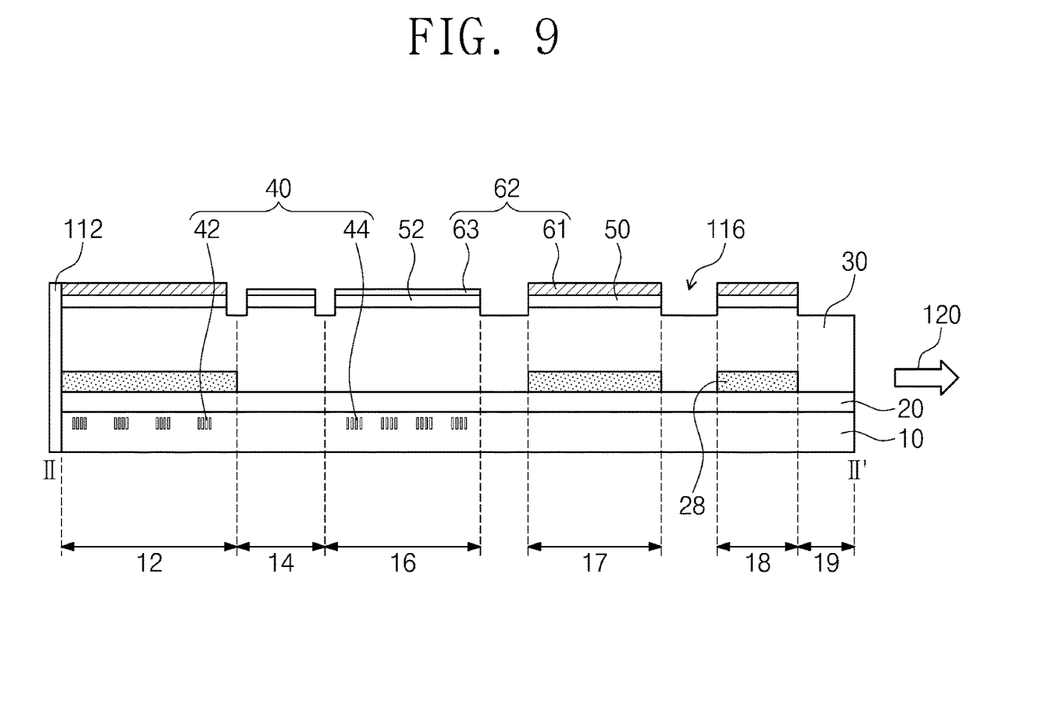
FIG. 9 is a cross-sectional view taken along line II-IP of FIG. 8.

FIG. 8 illustrates an example of the wavelength-selectable laser diode 100 of FIG. 1. FIG. 9 illustrates a view taken along line II-IP of FIG. 8.

Referring to FIGS. 8 and 9, a first grating 42 and a second grating 44 of the wavelength-selectable laser diode 100 may be disposed in a substrate 10. The first grating 42 may be disposed in the substrate 10 in a gain region 12, and the second grating 44 may be disposed in the substrate 10 in a tuning region 16.

A waveguide layer 20 may be a passive waveguide layer. The waveguide layer 20 may extend from the gain region 12 to a converting region 19. The waveguide layer 20 may include n+ InGaAs.

An active layer 28 may be provided on the waveguide layer 20 in each of the gain region 12, a modulating region 17, and an amplifying region 18. When an electric field is provided between an electrode layer 60 and the substrate 10, the active layer 28 may generate a gain of a laser beam 120 and modulate and/or amplify the laser beam 120. The active layer 28 may include p+ InGaAs.

A clad layer 30 may be disposed on the active layer 28 and the waveguide layer 20. The substrate 30 may have a trench 116 which defines the gain region 12, a phase adjusting region 14, the tuning region 16, the modulating region 17, the amplifying region 18, and the converting region 19.

An ohmic contact layer 50 may be disposed on the clad layer 30 in the gain region 12, the modulating region 17, and the amplifying region 18.

An interlayer insulating film 52 may be provided on the clad layer 30 in the phase adjusting region 14 and the tuning region 16. The interlayer insulating film 52 may electrically separate the clad layer 30 from the electrode layer 60. The interlayer insulating film 52 may include silicon oxide ($SiO_2$) or silicon nitride ($SiN_x$).

The electrode layer 60 may be disposed on the ohmic contact layer 50 and the interlayer insulating film 52. As one example, the electrode layer 60 may include electrodes 62 and pads 64. In a plan view, the electrodes 62 may be arranged along the waveguide layer 20. The pads 64 may be arranged outside the waveguide layer 20 and may be connected to the electrodes 62. As one example, the electrodes 62 may include a plate electrode 61 and a heater electrode 63.

The plate electrode 61 may be disposed on the ohmic contact layer 50 in the gain region 12, the modulating region 17, and the amplifying region 18. The plate electrode 61 may be electrically connected to the clad layer 30 by the ohmic contact layer 50.

The heater electrode 63 may be disposed on the interlayer insulating film 52 in the phase adjusting region 14 and the tuning region 16. The heater electrode 63 may be electrically insulated from the clad layer 30 by the interlayer insulating film 52. The heater electrode 63 may be connected to the pads 64 on both ends of the phase adjusting region 14. Also, the heater electrode 63 may be connected to the pads 64 on both ends of the tuning region 16. The heater electrode 63 may be heated according to voltage provided to the pads 64. When the heater electrode 63 is heated, the refractive index of the clad layer 30 may change. When the refractive index of the clad layer 30 changes, the phase of the laser beam 120 may be adjusted and second wavelengths 124 of the laser beam 120 may be tuned. In FIG. 8, a symbol I illustrated inside the pads 64 may represent electric current, and a symbol V may represent voltage.

Figure 10:
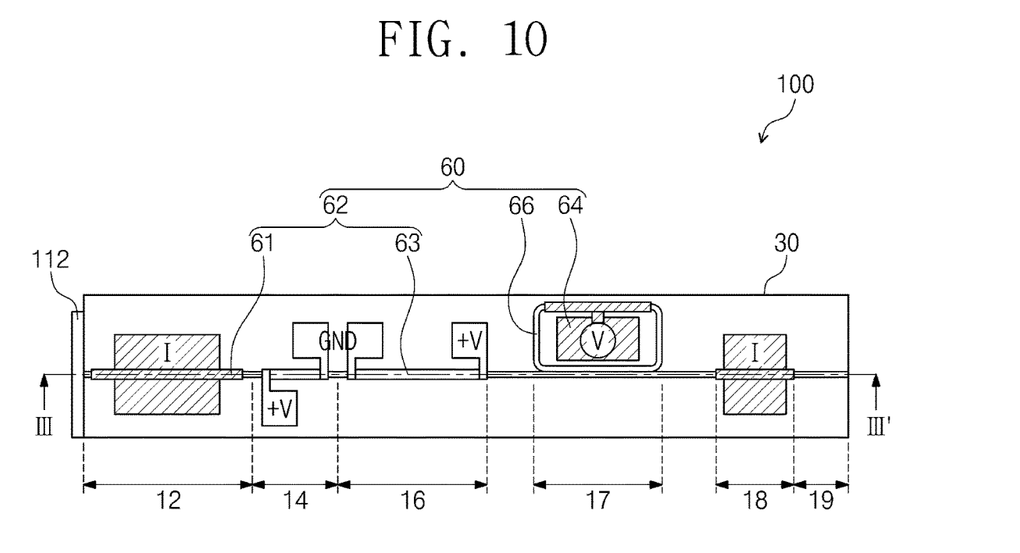
FIG. 10 is a plan view showing an example of a wavelength-selectable laser diode of FIG. 1.
Figure 11:
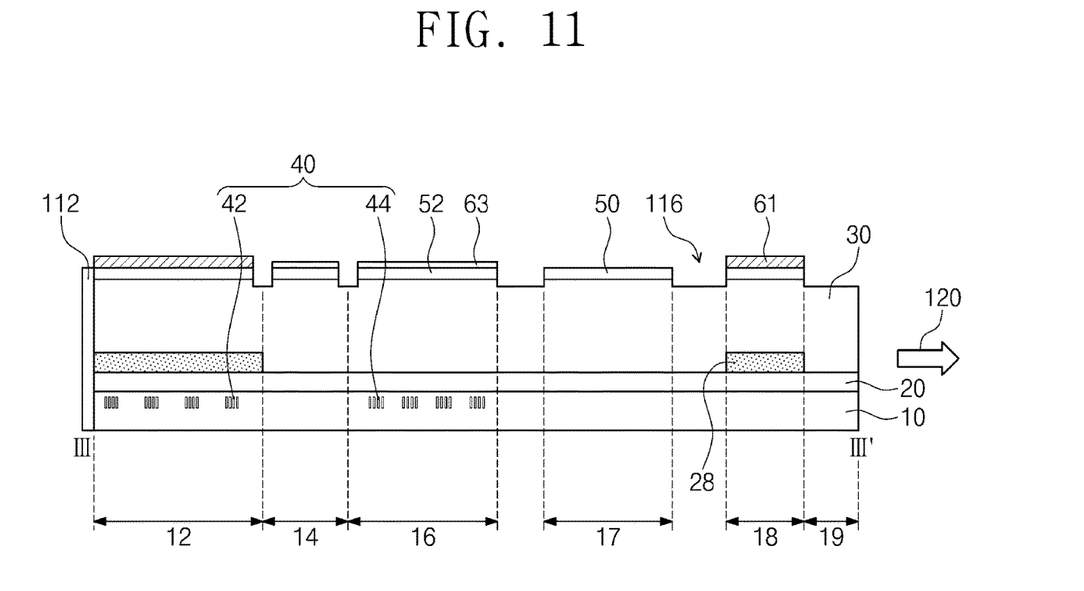
FIG. 11 is a cross-sectional view taken along line of FIG. 10.

FIG. 10 illustrates an example of the wavelength-selectable laser diode 100 of FIG. 1. FIG. 11 illustrates a view taken along line III-III' of FIG. 10.

Referring to FIGS. 10 and 11, an electrode layer 60 of the wavelength-selectable laser diode 100 may further include a ring cavity 66 disposed in a modulating region 17. In a plan view, the ring cavity 66 may be connected to a pad 64 on the modulating region 17 and surround the outside of the pad 64. A portion of the ring cavity 66 may be parallel to a waveguide layer 20. A portion of the length of the ring cavity 66 may modulate a laser beam 120 in the waveguide layer 20 as the ring cavity 66 induces an electric field when external power is applied to the pad 64 in the modulating region 17 parallel to the waveguide layer 20. The laser beam 120 may be modulated depending on the intensities of the electric field. A substrate 10, the waveguide layer 20, a clad layer 30, gratings 40, an ohmic contact layer 50, an interlayer insulating film 52, and an electrode layer 60 may be configured to be the same as those in FIGS. 8 and 9.

An active layer 28 may be disposed on the waveguide layer 20 in a gain region 12 and an amplifying region 18. The active layer 28 may not be disposed on a modulating region 17.

As described above, the wavelength-selectable laser diode according to the inventive concept may generate the oscillation wavelength of the laser beam, which matches the WDM wavelength grid, using the first and second gratings having the first and second grating lengths different from each other. Also, the optical communication apparatus according to the embodiment of the inventive concept may increase the reliability and lifespan of elements thereof using the residual wavelength-selectable laser diode.

The above-described contents are embodiments for implementing the present disclosure. The present disclosure may include not only the embodiments described above but also embodiments which may be simply design-modified or easily changed. Also, the present disclosure may include techniques which may be easily modified and applied in the future by using the embodiments described above.

What is claimed is:

1. A wavelength-selectable laser diode comprising:
a substrate comprising a gain region, a tuning region separated from the gain region, and a phase adjusting region between the tuning region and the gain region;
a waveguide layer on the substrate;
a clad layer on the waveguide layer; and
gratings disposed on the substrate or the clad layer in the gain region and the tuning region,
wherein the gratings comprise:
a first grating disposed in the gain region and having a first grating length; and
a second grating disposed in the tuning region and having a second grating length different from the first grating length,
wherein the first grating includes first group gratings having first sampling lengths,
wherein each of the first group gratings includes first sub group gratings having first super structure grating lengths,
wherein each of the first sub group gratings includes first unit gratings having first pitches,
wherein the second grating includes second group gratings having second sampling lengths different from the first sampling lengths,
wherein each of the second group gratings includes second sub group gratings having second super structure grating lengths different from the first super structure grating lengths, and
wherein each of the second sub group gratings includes second unit gratings having second pitches different from the first pitches.

2. The wavelength-selectable laser diode of claim 1, wherein the first pitches include a 3rd pitch, a 4th pitch, and a 5th pitch, and
the second pitches include a 6th pitch, a 7th pitch, and an 8th pitch.

3. The wavelength-selectable laser diode of claim 2, wherein the first super structure grating lengths include a 3rd super structure grating length, a 4th super structure grating length, and a 5th super structure grating length.

4. The wavelength-selectable laser diode of claim 3, wherein the second super structure grating lengths include a 6th super structure grating length, a 7th super structure grating length, and an 8th super structure grating length.

5. The wavelength-selectable laser diode of claim 1, wherein the first grating and the second grating comprise a sampled grating.

6. The wavelength-selectable laser diode of claim 1, wherein the first grating and the second grating comprise a super structure grating.

7. The wavelength-selectable laser diode of claim 1, wherein the waveguide layer comprises:
a first active waveguide disposed in the gain region; and
a passive waveguide disposed in the phase adjusting region and the tuning region.

8. The wavelength-selectable laser diode of claim 7, wherein the substrate further comprises a modulating region adjacent to the tuning region,
wherein the waveguide layer further comprises a second active waveguide disposed in the modulating region.

9. The wavelength-selectable laser diode of claim 8, wherein the substrate further comprises an amplifying region disposed adjacent to the modulating region,
wherein the first active waveguide is disposed in the amplifying region.

10. The wavelength-selectable laser diode of claim 8, further comprising an electrode layer which is provided with electrodes disposed on the waveguide layer and pads connected to the electrodes and disposed on the clad layer outside the waveguide layer,
wherein the electrodes comprise:
a plate electrode on the gain region; and
a heater electrode on the phase adjusting region and the tuning region.

11. The wavelength-selectable laser diode of claim 10, wherein the electrodes further comprise a cavity ring that surrounds one of the pads on the modulating region,
wherein the cavity ring is disposed adjacent to the waveguide layer.

12. The wavelength-selectable laser diode of claim 1, further comprising:
a lower electrode layer disposed below the substrate; and
a total reflection layer disposed on a side wall of the substrate adjacent to the gain region.

13. An optical communication apparatus comprising:
a plurality of wavelength-selectable laser diodes; and
an optical combiner connected to the plurality of wavelength-selectable laser diodes,
wherein the each of the plurality of wavelength-selectable laser diodes comprises:
a substrate comprising a gain region, a tuning region spaced apart from the gain region, and a phase adjusting region between the tuning region and the gain region;
a waveguide layer on the substrate;
a clad layer on the waveguide layer; and
gratings disposed on the substrate or the clad layer in the gain region and the tuning region,
wherein the gratings comprise:
a first grating disposed in the gain region and having a first grating length; and
a second grating disposed in the tuning region and having a second grating length different from the first grating length,
wherein the first grating includes first group gratings having first sampling lengths,
wherein each of the first group gratings includes first sub group gratings having first super structure grating lengths,
wherein each of the first sub group gratings includes first unit gratings having first pitches,
wherein the second grating includes second group gratings having second sampling lengths different from the first sampling lengths,
wherein each of the second group gratings includes second sub group gratings having second super structure grating lengths different from the first super structure grating lengths, and
wherein each of the second sub group gratings includes second unit gratings having second pitches different from the first pitches.

14. The optical communication apparatus of claim 13, further comprising an optical amplifier connected to the optical combiner.

15. The optical communication apparatus of claim 14, further comprising optical waveguides which are connected to the waveguide layer and connect the plurality of wavelength-selectable laser diodes to the optical combiner.

16. The optical communication apparatus of claim 13, wherein one of the plurality of wavelength-selectable laser diodes is residual.

* * * * *